(12) United States Patent
Schwerin et al.

(10) Patent No.: US 7,362,608 B2
(45) Date of Patent: *Apr. 22, 2008

(54) PHASE CHANGE MEMORY FABRICATED USING SELF-ALIGNED PROCESSING

(75) Inventors: Ulrike Gruening-von Schwerin, München (DE); Thomas Happ, Tarrytown, NY (US)

(73) Assignee: Infineon Technologies AG, Munich (DE)

( * ) Notice: Subject to any disclaimer, the term of this patent is extended or adjusted under 35 U.S.C. 154(b) by 89 days.

This patent is subject to a terminal disclaimer.

(21) Appl. No.: 11/366,151

(22) Filed: Mar. 2, 2006

(65) Prior Publication Data

US 2007/0206408 A1   Sep. 6, 2007

(51) Int. Cl.
  *G11C 11/00* (2006.01)
(52) U.S. Cl. .................. 365/163; 365/148; 365/113
(58) Field of Classification Search ............... 365/163, 365/148, 113
  See application file for complete search history.

(56) References Cited

U.S. PATENT DOCUMENTS

| 6,545,903 | B1* | 4/2003 | Wu ............... 365/148 |
| 6,579,760 | B1 | 6/2003 | Lung |
| 6,750,101 | B2 | 6/2004 | Lung |
| 7,208,751 | B2* | 4/2007 | Ooishi ............ 257/5 |
| 2005/0242338 | A1 | 11/2005 | Hart et al. |
| 2005/0254310 | A1* | 11/2005 | Lee et al. ........ 365/189.01 |

FOREIGN PATENT DOCUMENTS

DE  10 2004 014 487 A1   11/2005

OTHER PUBLICATIONS

S.J. Ahn et al., "Highly Manufacturable High Density Phase Change Memory of 64 Mb and Beyond", IEDM 2004.
H. Horrii et al., "A Novel Cell Technology Using N-doped GeSbTe Films for Phase Change RAM", VLSI 2003.
Y.N. Hwang et al., "Full Integration and Reliability Evaluation of Phase-change RAM Based on 0.24 μm-CMOS Technologies", VLSI, 2003.
Stefan Lai et al., "OUM—A 180 nm Nonvolatile Memory Cell Element Technology For Stand Alone and Embedded Applications", IEDM 2001.
Y.H. Ha et al., "An Edge Contact Type Cell for Phase Change RAM Featuring Very Low Power Consumption", VLSI, 2003.
F. Pellizzer et al., "Novel μTrench Phase-Change Memory Cell for Embedded and Stand-Alone Non-Volatile Memory Applications", VLSI, 2004.

* cited by examiner

*Primary Examiner*—Tuan T. Nguyen
*Assistant Examiner*—Hien Nguyen
(74) *Attorney, Agent, or Firm*—Dicke, Billig & Czaja, PLLC

(57) ABSTRACT

A memory includes transistors in rows and columns providing an array, first conductive lines in columns across the array, and second conductive lines encapsulated by dielectric material in rows across the array. Each second conductive line is coupled to one side of the source-drain path of the transistors in each row. The memory includes phase change elements between the second conductive lines and contacting the first conductive lines and self-aligned to the first conductive lines. Each phase change element is coupled to the other side of the source-drain path of a transistor.

22 Claims, 13 Drawing Sheets

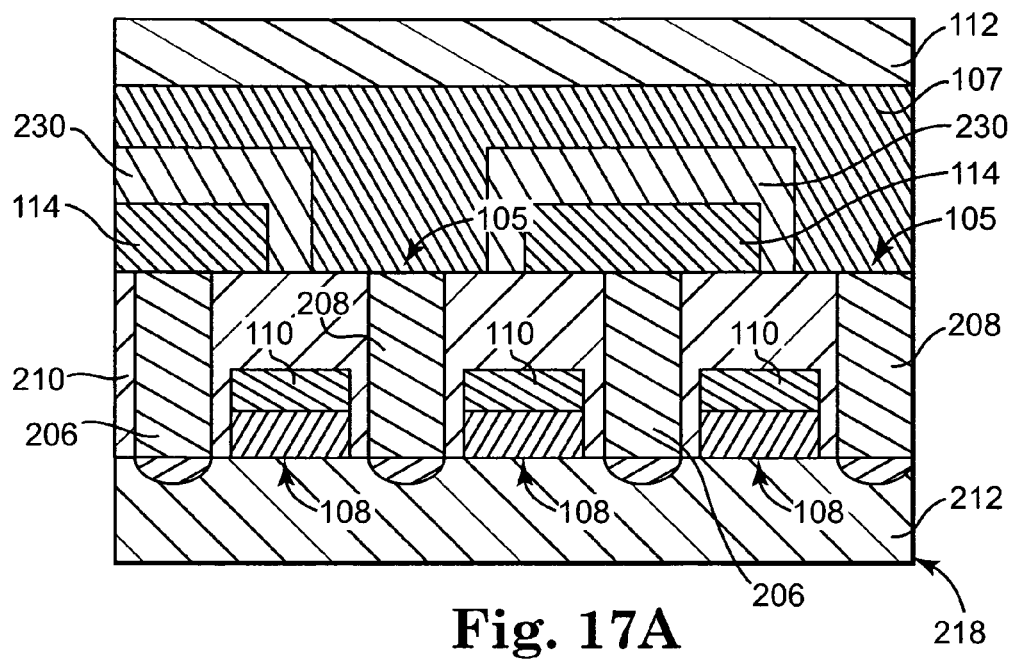
Fig. 17A
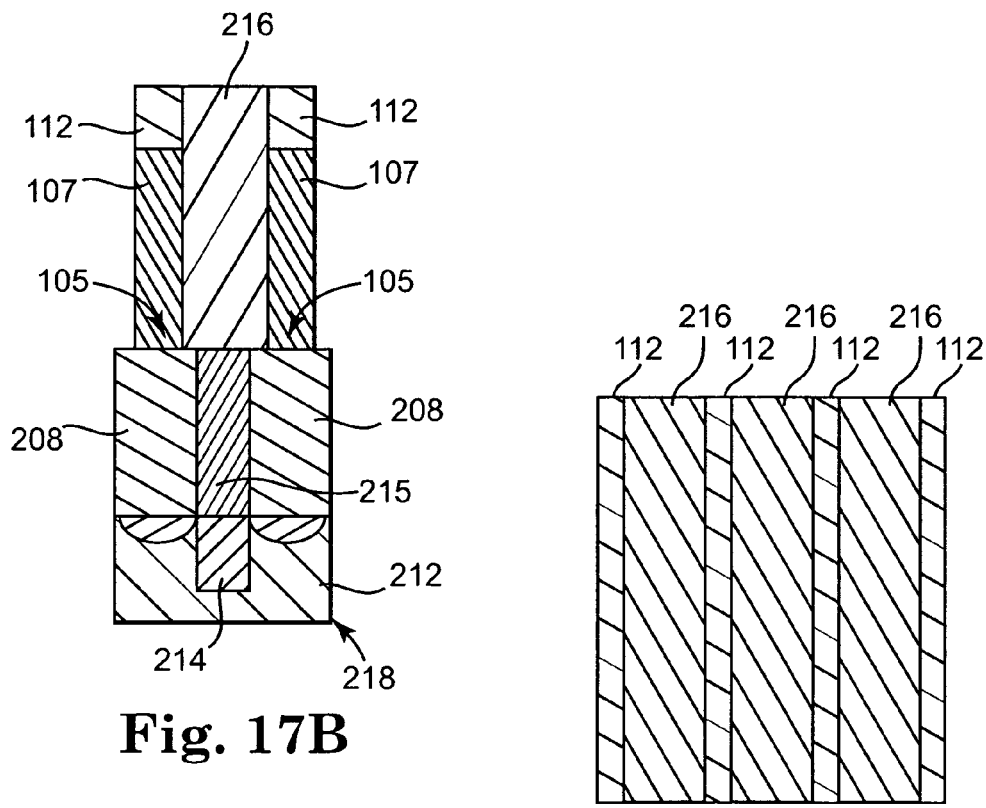
Fig. 17B
Fig. 17C

PHASE CHANGE MEMORY FABRICATED USING SELF-ALIGNED PROCESSING

CROSS-REFERENCE TO RELATED APPLICATIONS

This application is related to U.S. patent application Ser. No. 11/366,370, entitled "PHASE CHANGE MEMORY FABRICATED USING SELF-ALIGNED PROCESSING" and U.S. patent application Ser. No. 11/366,706, entitled "PHASE CHANGE MEMORY FABRICATED USING SELF-ALIGNED PROCESSING," both filed concurrently on the same day with the present application and both incorporated herein by reference.

BACKGROUND

One type of non-volatile memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data.

Phase change in the phase change materials may be induced reversibly. In this way, the memory may change from the amorphous state to the crystalline state and from the crystalline state to the amorphous state in response to temperature changes. The temperature changes to the phase change material may be achieved in a variety of ways. For example, a laser can be directed to the phase change material, current may be driven through the phase change material, or current can be fed through a resistive heater adjacent the phase change material. In any of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

For data storage applications, reducing the physical memory cell size is a continuing goal. Reducing the physical memory cell size increases the storage density of the memory and reduces the cost of the memory. To reduce the physical memory cell size, the memory cell layout should be lithography friendly. In addition, since interface resistances between metal and active material within memory cells contributes considerably to the overall resistance for small areas, the interface areas should be well controlled. Finally, the memory cell layout should have mechanical stability to improve the chemical mechanical planarization (CMP) process window to enable greater yields.

For these and other reasons, there is a need for the present invention.

SUMMARY

One embodiment of the present invention provides a memory. The memory includes transistors in rows and columns providing an array, first conductive lines in columns across the array, and second conductive lines encapsulated by dielectric material in rows across the array. Each second conductive line is coupled to one side of the source-drain path of the transistors in each row. The memory includes phase change elements between the second conductive lines and contacting the first conductive lines and self-aligned to the first conductive lines. Each phase change element is coupled to the other side of the source-drain path of a transistor.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 17A illustrates a cross-sectional view of one embodiment of the preprocessed wafer, encapsulated ground line, phase change material layer, and bit lines.

FIG. 17B illustrates a perpendicular cross-sectional view of the wafer illustrated in FIG. 17A.

FIG. 17C illustrates a top view of the wafer illustrated in FIG. 17A.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
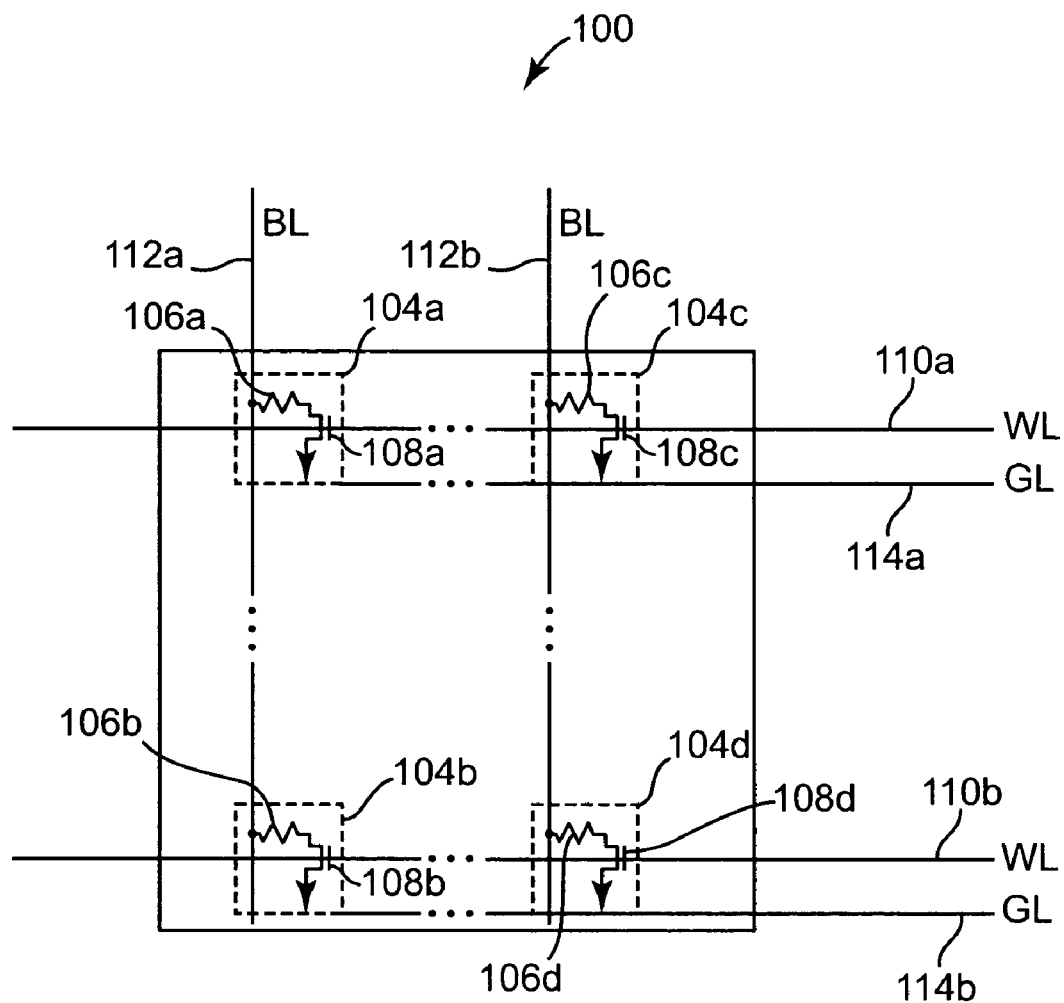
FIG. 1 is a diagram illustrating one embodiment of an array of phase change memory cells.

FIG. 1 is a diagram illustrating one embodiment of an array of phase-change memory cells 100. Memory array 100 is fabricated using line lithography and self-aligned processing to minimize critical lithography steps. In addition, the interface resistance between metal and active material is overlay-insensitive and by maximizing the interface areas, parasitic resistances are minimized. Memory array 100 does not have any isolated, small patterns such that the chemical mechanical planarization (CMP) process window is improved and mechanical stability is improved.

Memory array 100 includes a plurality of phase-change memory cells 104a-104d (collectively referred to as phase-change memory cells 104), a plurality of bit lines (BLs) 112a-112b (collectively referred to as bit lines 112), a plurality of word lines (WLs) 110a-110b (collectively referred to as word lines 110), and a plurality of ground lines (GLs) 114a-114b (collectively referred to as ground lines 114).

As used herein, the term "electrically coupled" is not meant to mean that the elements must be directly coupled together and intervening elements may be provided between the "electrically coupled" elements.

Each phase-change memory cell 104 is electrically coupled to a word line 110, a bit line 112, and a ground line 114. For example, phase-change memory cell 104a is electrically coupled to bit line 112a, word line 110a, and ground line 114a, and phase-change memory cell 104b is electrically coupled to bit line 112a, word line 110b, and ground line 114b. Phase-change memory cell 104c is electrically coupled to bit line 112b, word line 110a, and ground line 114a, and phase-change memory cell 104d is electrically coupled to bit line 112b, word line 110b, and ground line 114b.

Each phase-change memory cell 104 includes a phase-change element 106 and a transistor 108. While transistor 108 is a field-effect transistor (FET) in the illustrated embodiment, in other embodiments, transistor 108 can be another suitable device such as a bipolar transistor or a 3D transistor structure. Phase-change memory cell 104a includes phase-change element 106a and transistor 108a. One side of phase-change element 106a is electrically coupled to bit line 112a, and the other side of phase-change element 106a is electrically coupled to one side of the source-drain path of transistor 108a. The other side of the source-drain path of transistor 108a is electrically coupled to ground line 114a. The gate of transistor 108a is electrically coupled to word line 110a. Phase-change memory cell 104b includes phase-change element 106b and transistor 108b. One side of phase-change element 106b is electrically coupled to bit line 112a, and the other side of phase-change element 106b is electrically coupled to one side of the source-drain path of transistor 108b. The other side of the source-drain path of transistor 108b is electrically coupled to ground line 114b. The gate of transistor 108b is electrically coupled to word line 110b.

Phase-change memory cell 104c includes phase-change element 106c and transistor 108c. One side of phase-change element 106c is electrically coupled to bit line 112b and the other side of phase-change element 106c is electrically coupled to one side of the source-drain path of transistor 108c. The other side of the source-drain path of transistor 108c is electrically coupled to ground line 114a. The gate of transistor 108c is electrically coupled to word line 110a. Phase-change memory cell 104d includes phase-change element 106d and transistor 108d. One side of phase-change element 106d is electrically coupled to bit line 112b and the other side of phase-change element 106d is electrically coupled to one side of the source-drain path of transistor 108d. The other side of the source-drain path of transistor 108d is electrically coupled to ground line 114b. The gate of transistor 108d is electrically coupled to word line 110b.

In another embodiment, each phase-change element 106 is electrically coupled to a ground line 114 and each transistor 108 is electrically coupled to a bit line 112. For example, for phase-change memory cell 104a, one side of phase-change element 106a is electrically coupled to ground line 114a. The other side of phase-change element 106a is electrically coupled to one side of the source-drain path of transistor 108a. The other side of the source-drain path of transistor 108a is electrically coupled to bit line 112a. In general, the ground lines 114 have a lower potential than the bit lines 112.

Each phase-change element 106 comprises a phase-change material that may be made up of a variety of materials in accordance with the present invention. Generally, chalcogenide alloys that contain one or more elements from group VI of the periodic table are useful as such materials. In one embodiment, the phase-change material of phase-change element 106 is made up of a chalcogenide compound material, such as GeSbTe, SbTe, GeTe or AgInSbTe. In another embodiment, the phase-change material is chalcogen free, such as GeSb, GaSb, InSb, or GeGaInSb. In other embodiments, the phase-change material is made up of any suitable material including one or more of the elements Ge, Sb, Te, Ga, As, In, Se, and S.

During a set operation of phase-change memory cell 104a, a set current or voltage pulse is selectively enabled and sent through bit line 112a to phase-change element 106a thereby heating it above it's crystallization temperature (but usually below it's melting temperature) with word line 110a selected to activate transistor 108a. In this way, phase-change element 106a reaches its crystalline state during this set operation. During a reset operation of phase-change memory cell 104a, a reset current or voltage pulse is selectively enabled to bit line 112a and sent to phase-change material element 106a. The reset current or voltage quickly heats phase-change element 106a above its melting temperature. After the current or voltage pulse is turned off, the phase-change element 106a quickly quench cools into the amorphous state. Phase-change memory cells 104b-104d and other phase-change memory cells 104 in memory array 100 are set and reset similarly to phase-change memory cell 104a using a similar current or voltage pulse.

Figure 2A:
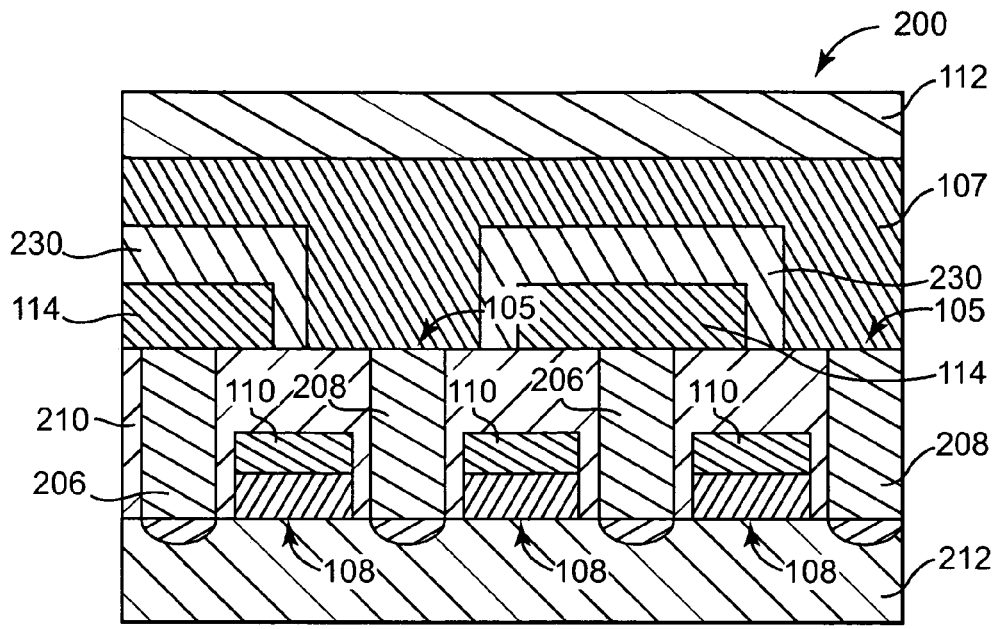
FIG. 2A illustrates a cross-sectional view of one embodiment of an array of phase change memory cells.
Figure 2B:
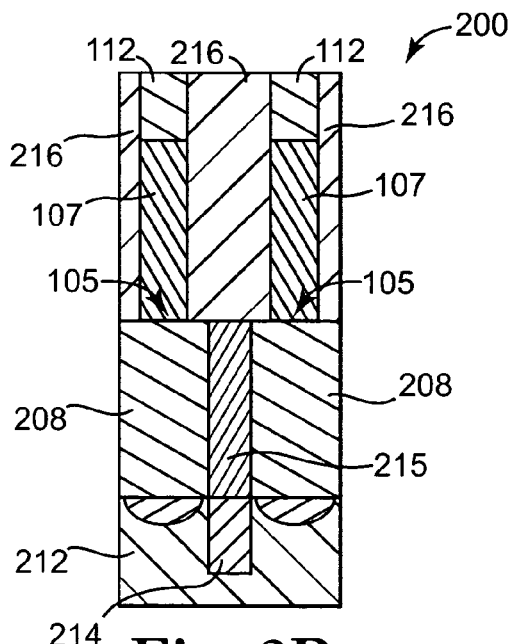
FIG. 2B illustrates a perpendicular cross-sectional view of the array of phase change memory cells illustrated in FIG. 2A.
Figure 2C:
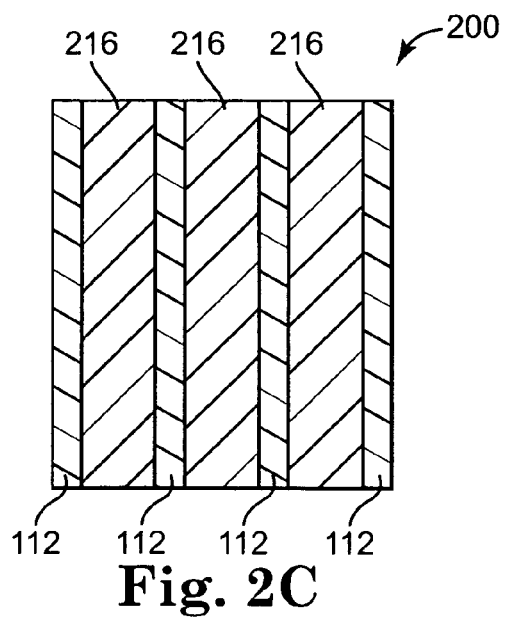
FIG. 2C illustrates a top view of the array of phase change memory cells illustrated in FIG. 2A.

FIG. 2A illustrates a cross-sectional view of one embodiment of an array of phase change memory cells 200. FIG. 2B illustrates a perpendicular cross-sectional view of array of phase change memory cells 200 illustrated in FIG. 2A. FIG. 2C illustrates a top view of array of phase change memory cells 200 illustrated in FIG. 2A. In one embodiment, array of phase change memory cells 100 is similar to array of phase change memory cells 200. Array of phase change memory cells 200 includes substrate 212, transistors 108, word lines 110, first contacts 206, second contacts 208, ground lines 114, dielectric material 210, 216, and 230, shallow trench isolation (STI) 214, inter level dielectric (ILD) 215, phase change material 107, and bits lines 112. Metal wiring (not shown) follows after the bit line level.

Transistors 108 for selecting storage locations 105 in phase change material 107 are formed in substrate 212 in rows and columns. The gates of transistors 108 are electrically coupled to word lines 110. Dielectric material 210 is deposited over transistors 108 and word lines 110. First contacts 206 electrically couple one side of the source-drain path of each transistor 108 to a ground line 114. Second contacts 208 electrically couple the other side of the source-drain path of each transistor 108 to a storage location 105, which is a part of phase change material 107. Each line of phase change material 107 is electrically coupled to a bit line 112. Bit lines 112 are perpendicular to word lines 110 and ground lines 114. Dielectric material 230 insulates ground lines 114 above first contacts 206. Dielectric material 216 insulates bits lines 112 and lines of phase change material 107 from adjacent bit lines 112 and lines of phase change material 107. STI 214 insulates transistors 108 from adjacent transistors 108, and ILD 215 insulates second contacts 208 from adjacent second contacts 208.

Lines of phase change material 107, which include storage locations 105, are self-aligned to bit lines 112. The self-alignment minimizes critical lithography steps in the fabrication of array of phase change memory cells 200. In addition, with self-alignment the interface resistances between second contacts 208 and phase change material 107 and between phase change material 107 and bit lines 112 is overlay insensitive and parasitic resistances are minimized.

In one embodiment, array of phase change memory cells 200 is scalable to $8F^2$ for dual gate memory cells, where "F" is the minimum feature size, or to $6F^2$ for single gate memory cells. In the embodiment for single gate memory cells, an active gate of a transistor 108 between every two adjacent memory cells is replaced with an isolation gate (i.e., the transistor is not used as a switch; rather it is always turned off), and a dummy ground line is formed above the isolation gate to separate adjacent memory cells. A first embodiment of a method for fabricating array of phase change memory cells 200 is described and illustrated with reference to the following FIGS. 3A-9C. A second embodiment of a method for fabricating array of phase change memory cells 200 is described and illustrated with reference to the following FIGS. 10A-17C.

Figure 3A:
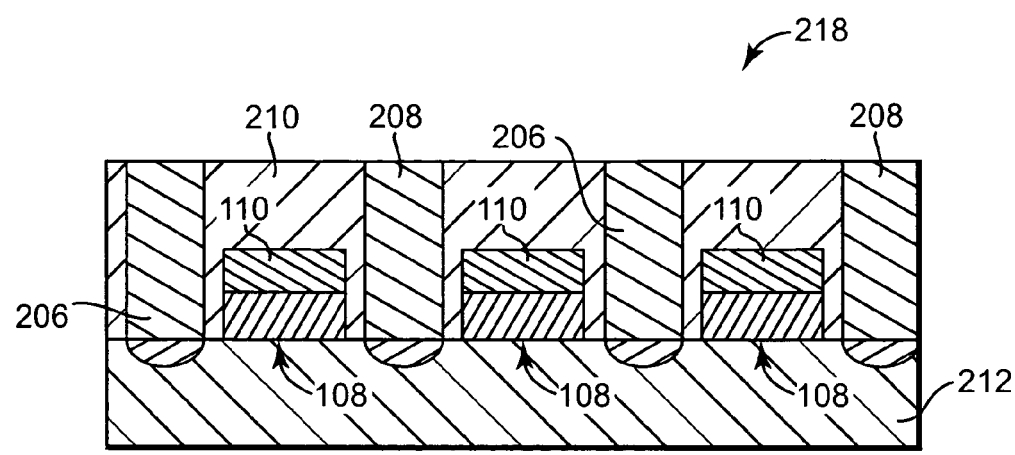
FIG. 3A illustrates a cross-sectional view of one embodiment of a preprocessed wafer.
Figure 3B:
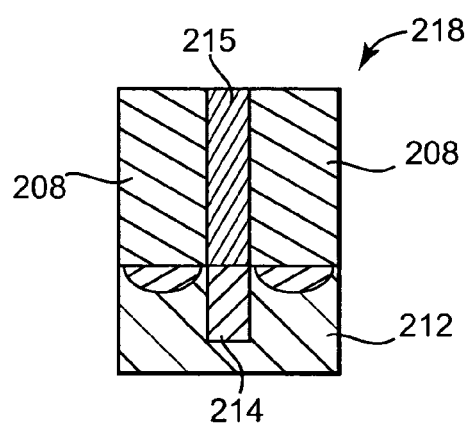
FIG. 3B illustrates a perpendicular cross-sectional view of the preprocessed wafer illustrated in FIG. 3A.
Figure 3C:
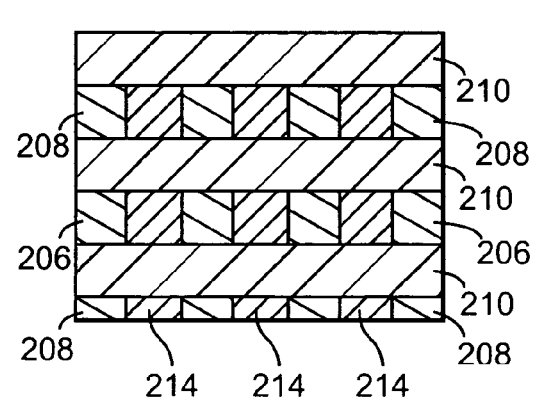
FIG. 3C illustrates a top view of the preprocessed wafer illustrated in FIG. 3A.

FIG. 3A illustrates a cross-sectional view of one embodiment of a preprocessed wafer 218. FIG. 3B illustrates a perpendicular cross-sectional view of preprocessed wafer 218 illustrated in FIG. 3A. FIG. 3C illustrates a top view of preprocessed wafer 218 illustrated in FIG. 3A. Preprocessed wafer 218 includes substrate 212, transistors 108, word lines 110, first contacts 206, second contacts 208, STI 214, ILD 215, and dielectric material 210.

Transistors 108 are formed in substrate 212 in rows and columns. The gates of transistors 108 are electrically coupled to word lines 110. Dielectric material 210 is deposited over transistors 108 and word lines 110. First contacts 206 are electrically coupled to one side of the source-drain path of each transistor 108. Second contacts 208 are electrically coupled to the other side of the source-drain path of each transistor 108. STI 214 insulates transistors 108 from adjacent transistors 108, and ILD 215 insulates second contacts 208 from adjacent second contacts 208.

First contacts 206 and second contacts 208 are contact plugs, such as W plugs, Cu plugs, or other suitable conducting material plugs. Word lines 110 comprise doped poly-Si, W, TiN, NiSi, CoSi, TiSi, $WSi_x$, or another suitable material. Dielectric material 210 comprises SiN or other suitable material that enables a borderless contact formation process for first contacts 206 and second contacts 208. STI 214 and ILD 215 comprise $SiO_2$, fluorinated silica glass (FSG), boro-phosphorous silicate glass (BPSG), boro-silicate glass (BSG), or other suitable dielectric material. Word lines 110 are perpendicular to STI 214 and ILD 215.

Figure 4:
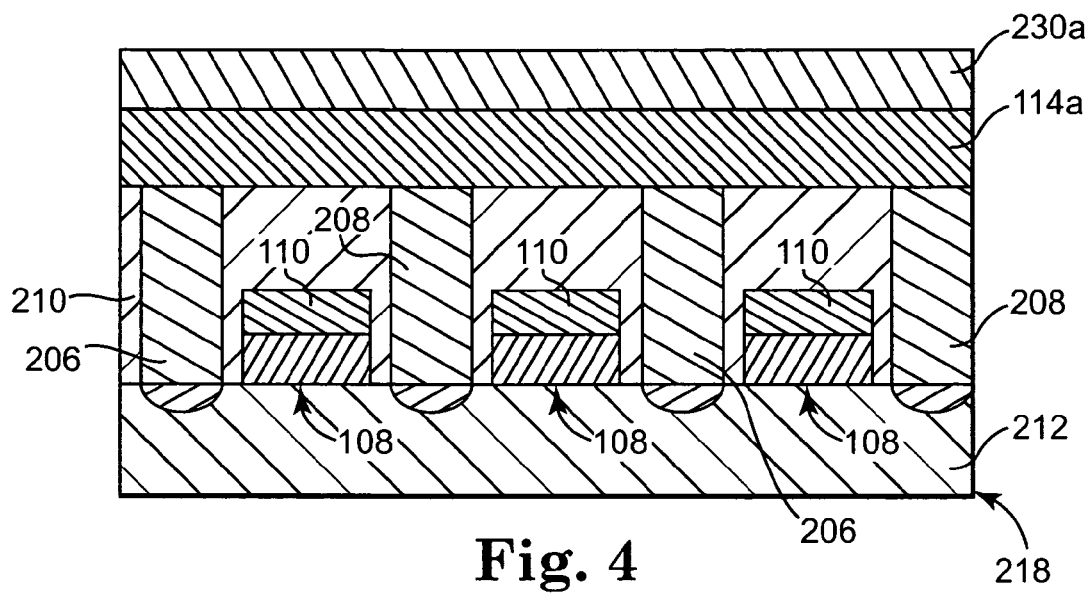
FIG. 4 illustrates a cross-sectional view of one embodiment of the preprocessed wafer, a conductive material layer, and a first dielectric material layer.

FIG. 4 illustrates a cross-sectional view of one embodiment of preprocessed wafer 218, a conductive material layer 114a, and a first dielectric material layer 230a. Conductive material, such as W, Al, Cu, or other suitable conductive material is deposited over preprocessed wafer 218 to provide conductive material layer 114a. Conductive material layer 114a is deposited using chemical vapor deposition (CVD), atomic layer deposition (ALD), metal organic chemical vapor deposition (MOCVD), plasma vapor deposition (PVD), jet vapor deposition (JVP), or other suitable deposition technique.

Dielectric material, such as SiN or other suitable dielectric material, is deposited over conductive material layer 114a to provide first dielectric material layer 230a. First dielectric material layer 230a is deposited using CVD, ALD, MOCVD, PVD, JVP, high-density plasma (HDP), or other suitable deposition technique.

Figure 5:
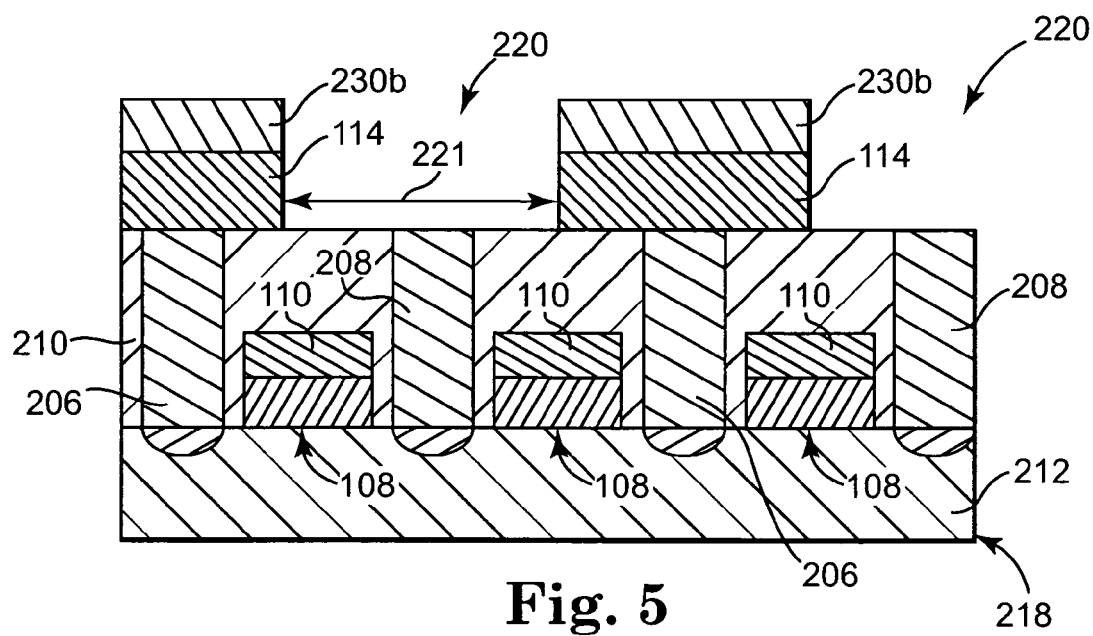
FIG. 5 illustrates a cross-sectional view of one embodiment of the preprocessed wafer, ground lines, and first dielectric material layer after etching.

FIG. 5 illustrates a cross-sectional view of one embodiment of preprocessed wafer 218, ground lines 114, and first dielectric material layer 230b after etching first dielectric material layer 230a and conductive material layer 114a. First dielectric material layer 230a and conductive material layer 114a are etched to provide first dielectric material layer 230b and ground lines 114 and to form trenches 220. Line lithography is used to pattern trenches 220 having a width 221 to expose second contacts 208. The line lithography does not need to be precisely centered over second contacts 208 as long as second contacts 208 are exposed. In this way, the line lithography is less critical yet the desired memory cell size is obtained.

Figure 6:
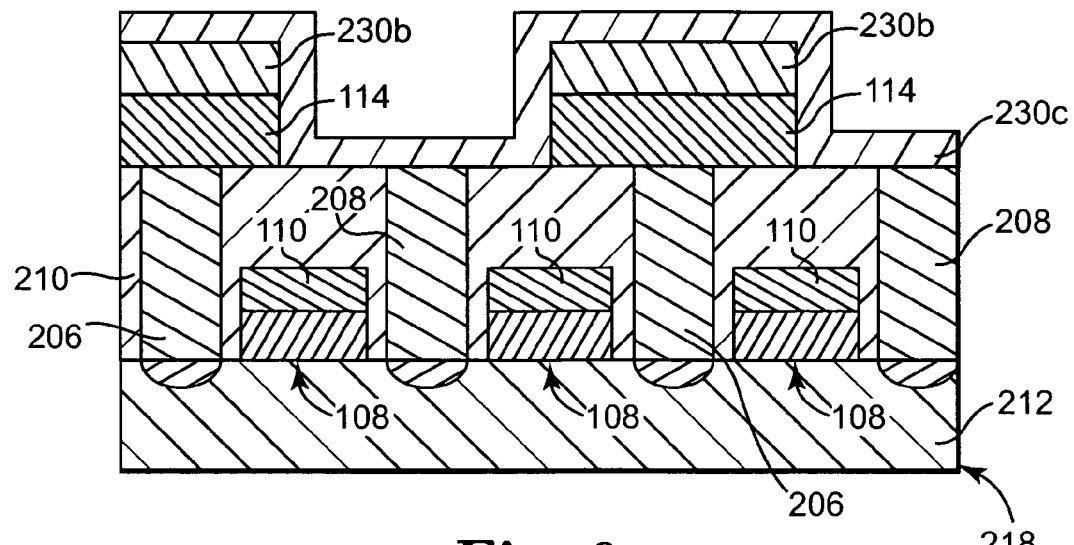
FIG. 6 illustrates a cross-sectional view of one embodiment of the preprocessed wafer, ground lines, first dielectric material layer, and a second dielectric material layer.

FIG. 6 illustrates a cross-sectional view of one embodiment of preprocessed wafer 218, ground lines 114, first dielectric material layer 230b, and a second dielectric material layer 230c. Dielectric material, such as SiN or other suitable dielectric material, is conformally deposited over exposed portions of first dielectric material layer 230b, ground lines 114, and preprocessed wafer 218 to provide second dielectric material layer 230c. Second dielectric material layer 230c is deposited using CVD, ALD, MOCVD, PVD, JVP, HDP, or other suitable deposition technique.

Figure 7:
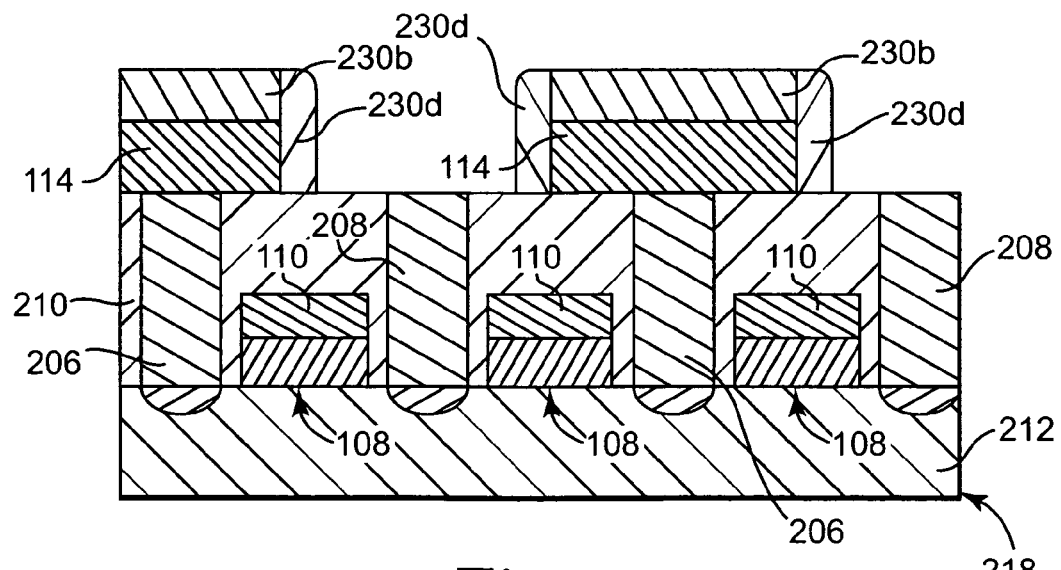
FIG. 7 illustrates a cross-sectional view of one embodiment of the preprocessed wafer, ground lines, first dielectric material layer, and sidewall spacers after etching.

FIG. 7 illustrates a cross-sectional view of one embodiment of preprocessed wafer 218, ground lines 114, first dielectric material layer 230b, and sidewall spacers 230d after etching second dielectric material layer 230c. Second dielectric material layer 230c is etched using a spacer etch to form sidewall spacers 230d and to expose second contacts 208. First dielectric material layer 230b and sidewall spacers 230d are collectively referred to as dielectric material 230.

Figure 8A:
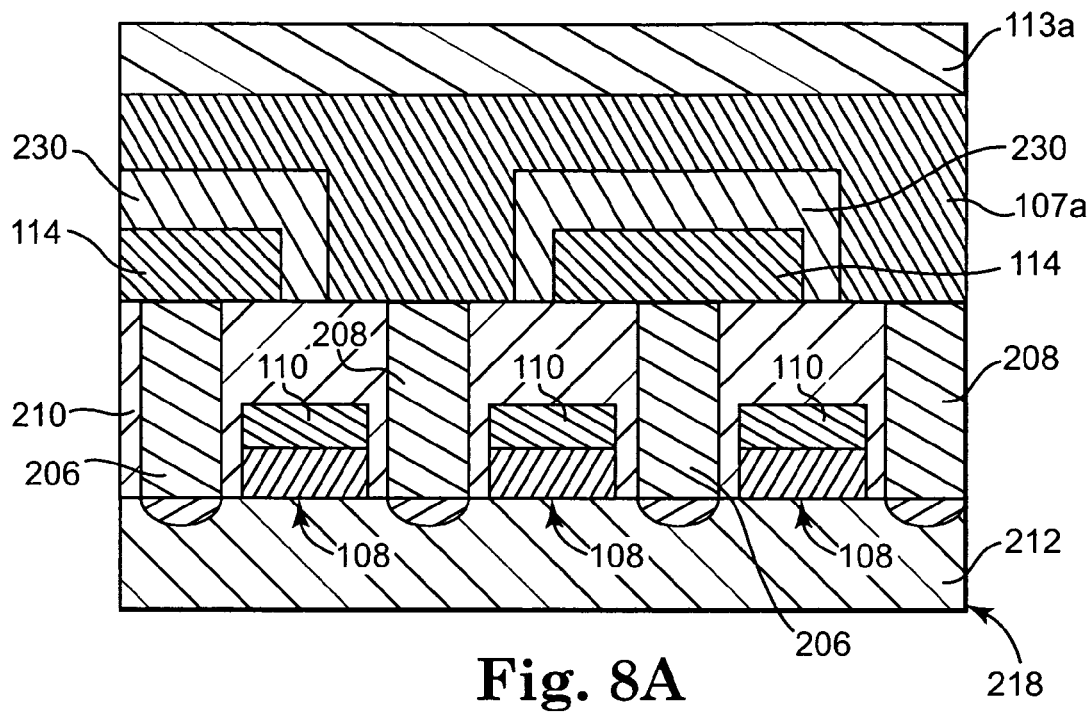
FIG. 8A illustrates a cross-sectional view of one embodiment of the preprocessed wafer, encapsulated ground lines, a phase change material layer, and an electrode material layer.
Figure 8B:
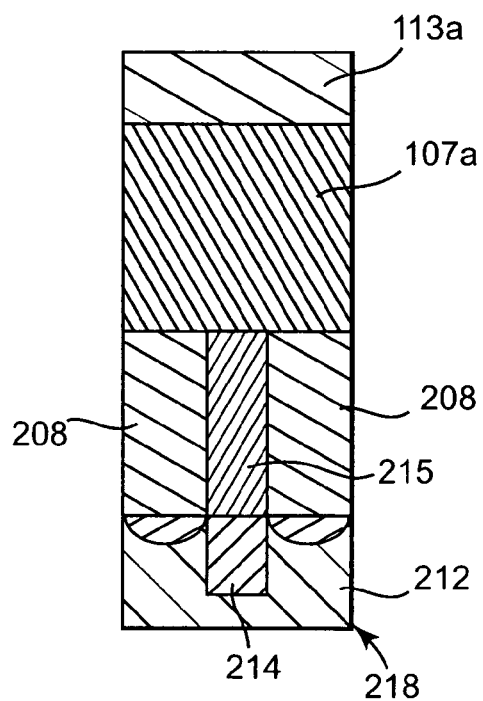
FIG. 8B illustrates a perpendicular cross-sectional view of the wafer illustrated in FIG. 8A.

FIG. 8A illustrates a cross-sectional view of one embodiment of preprocessed wafer 218, ground lines 114 encapsulated by dielectric material 230, a phase change material layer 107a, and an electrode material layer 113a. FIG. 8B illustrates a perpendicular cross-sectional view of the wafer illustrated in FIG. 8A. Phase change material, such as a chalcogenide compound material or other suitable phase change material, is deposited over exposed portions of dielectric material 230 and preprocessed wafer 218 to provide phase change material layer 107a. Phase change material layer 107a is deposited using CVD, ALD, MOCVD, PVD, JVP, or other suitable deposition technique. In one embodiment, phase change material layer 107a is planarized to expose dielectric material 230.

Electrode material, such as TiN, TaN, W, Al, Cu, TiSiN, TaSiN, or other suitable electrode material, is deposited over phase change material layer 107a to provide electrode material layer 113a. Electrode material layer 113a is deposited using CVD, ALD, MOCVD, PVD, JVP, or other suitable deposition technique.

Figure 9A:
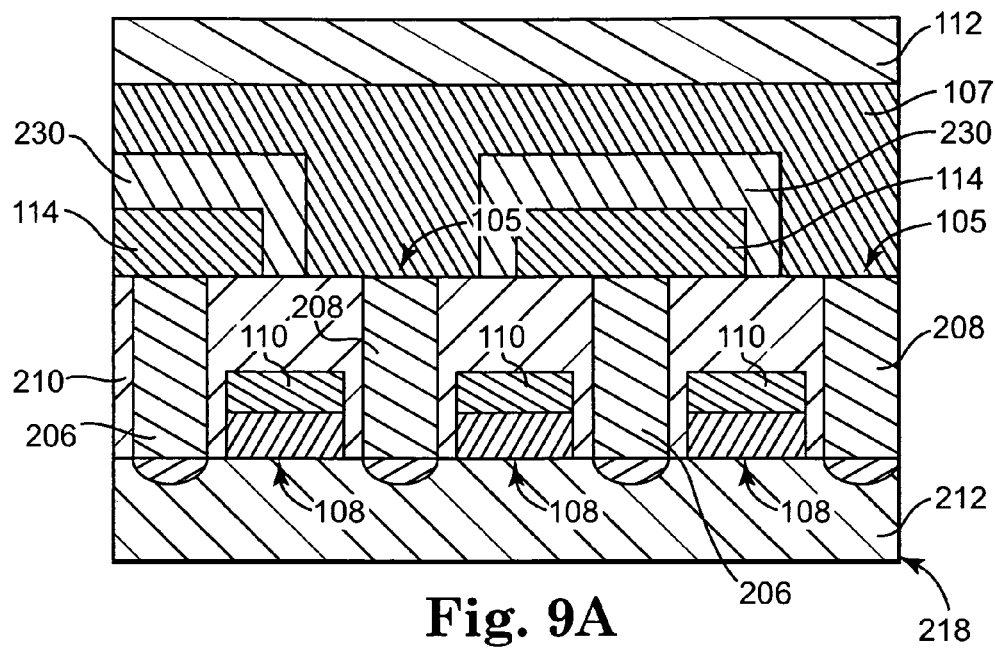
FIG. 9A illustrates a cross-sectional view of one embodiment of the preprocessed wafer, encapsulated ground lines, phase change material layer, and bit lines after etching.
Figure 9B:
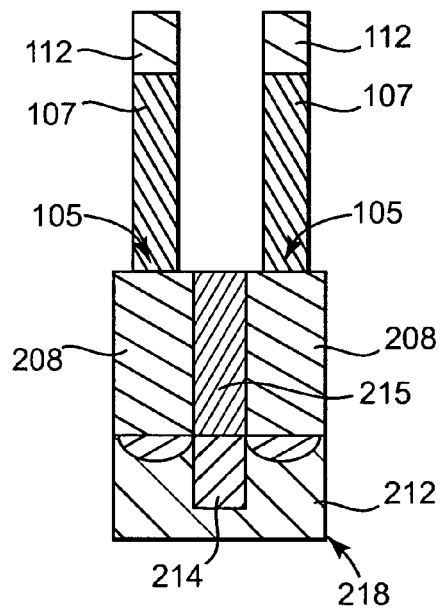
FIG. 9B illustrates a perpendicular cross-sectional view of the wafer illustrated in FIG. 9A.
Figure 9C:
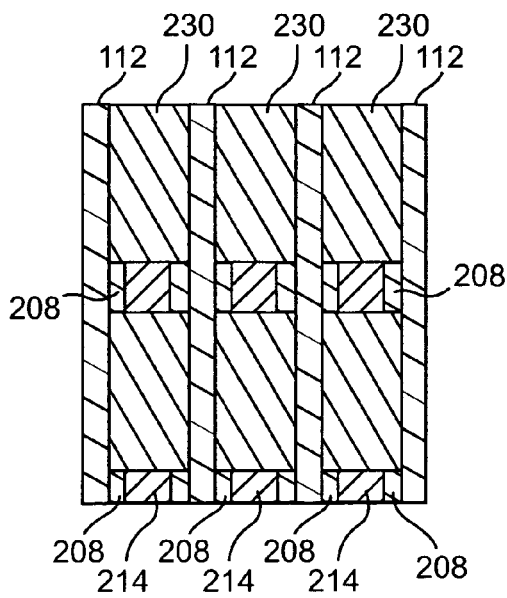
FIG. 9C illustrates a top view of the wafer illustrated in FIG. 9A.

FIG. 9A illustrates a cross-sectional view of one embodiment of preprocessed wafer 218, ground lines 114 encapsulated by dielectric material 230, phase change material layer 107, and bit lines 112 after etching electrode material layer 113a and phase change material layer 107a. FIG. 9B illustrates a perpendicular cross-sectional view of the wafer illustrated in FIG. 9A, and FIG. 9C illustrates a top view of the wafer illustrated in FIG. 9A. Electrode material layer 113a and phase change material layer 107a are etched to provide bit lines 112 and phase change material layer 107, which is self-aligned to bit lines 112. In the embodiment where phase change material layer 107a is planarized to expose dielectric material 230, electrode material layer 113a and phase change material layer 107a are etched to provide bit lines 112 and phase change elements 106, which are self-aligned to bit lines 112.

In one embodiment, phase change material layer 107 is optionally undercut etched. Line lithography is used to pattern bit lines 112 and lines of phase change material 107 perpendicular to trenches 220 such that each storage location 105 in phase change material 107 contacts a second contact 208. The line lithography does not need to be precisely centered over second contacts 208 as long as the bottom portion of each storage location 105 in phase change material 107 contacts a second contact 208. In this way, the line lithography is less critical yet the desired memory cell size is obtained.

Dielectric material, such as $SiO_2$, FSG, BPSG, BSG, or other suitable dielectric material, is deposited over exposed portions of bit lines 112, phase change material layer 107, dielectric material layer 230, and preprocessed wafer 218. The dielectric material layer is deposited using CVD, ALD, MOCVD, PVD, JVP, HDP, or other suitable deposition technique. The dielectric material layer is planarized to expose bit lines 112 and provide dielectric material layer 216. The dielectric material layer is planarized using CMP or another suitable planarization technique to provide array of phase change memory cells 200a illustrated in FIGS. 2A-2C.

Figure 10A:
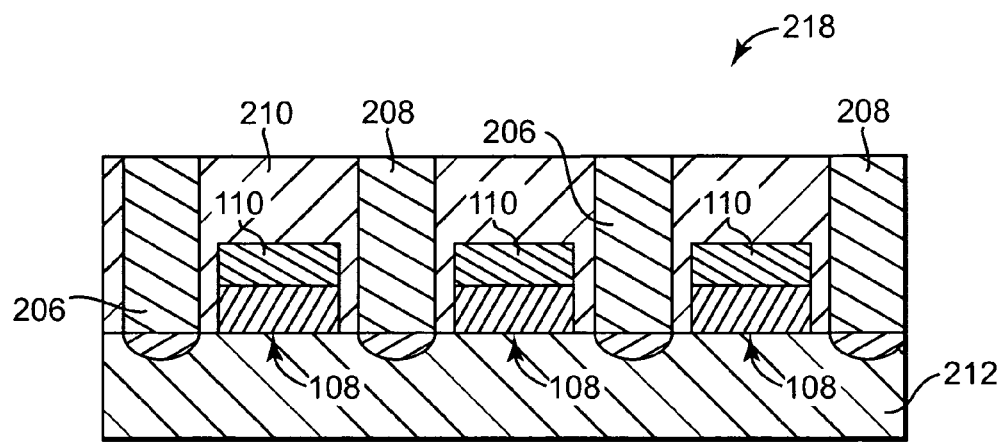
FIG. 10A illustrates a cross-sectional view of one embodiment of a preprocessed wafer.
Figure 10B:
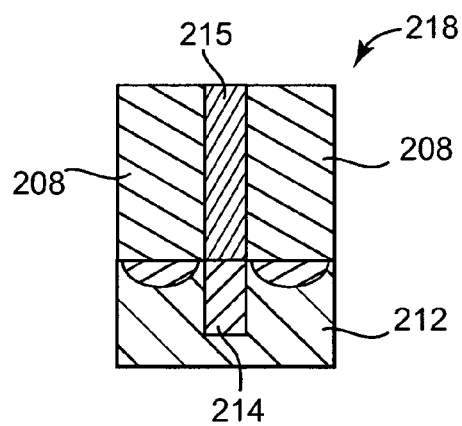
FIG. 10B illustrates a perpendicular cross-sectional view of the preprocessed wafer illustrated in FIG. 10A.
Figure 10C:
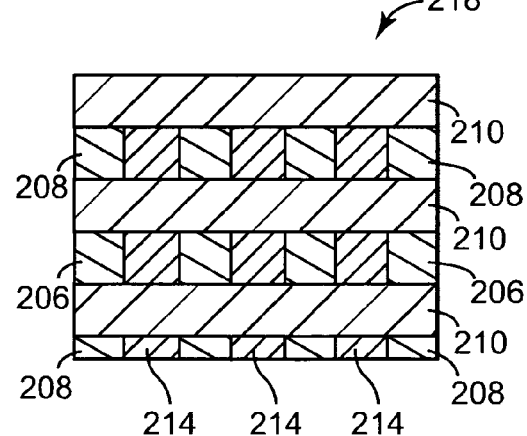
FIG. 10C illustrates a top view of the preprocessed wafer illustrated in FIG. 10A.

FIG. 10A illustrates a cross-sectional view of one embodiment of a preprocessed wafer 218. FIG. 10B illustrates a perpendicular cross-sectional view of preprocessed wafer 218 illustrated in FIG. 10A. FIG. 10C illustrates a top view of preprocessed wafer 218 illustrated in FIG. 10A. Preprocessed wafer 218 includes substrate 212, transistors 108, word lines 110, first contacts 206, second contacts 208, STI 214, ILD 215, and dielectric material 210.

Transistors 108 are formed in substrate 212 in rows and columns. The gates of transistors 108 are electrically coupled to word lines 110. Dielectric material 210 is deposited over transistors 108 and word lines 110. First contacts 206 are electrically coupled to one side of the source-drain path of each transistor 108. Second contacts 208 are electrically coupled to the other side of the source-drain path of each transistor 108. STI 214 insulates transistors 108 from adjacent transistors 108, and ILD 215 insulates second contacts 208 from adjacent second contacts 208.

First contacts 206 and second contacts 208 are contact plugs, such as W plugs, Cu plugs, or other suitable conducting material plugs. Word lines 110 comprise doped poly-Si, W, TiN, NiSi, CoSi, TiSi, $WSi_x$, or another suitable material. Dielectric material 210 comprises SiN or other suitable material that enables a borderless contact formation process for first contacts 206 and second contacts 208. STI 214 and ILD 215 comprise SiO$_2$, FSG, BPSG, BSG, or other suitable dielectric material. Word lines 110 are perpendicular to STI 214 and ILD 215.

Figure 11:
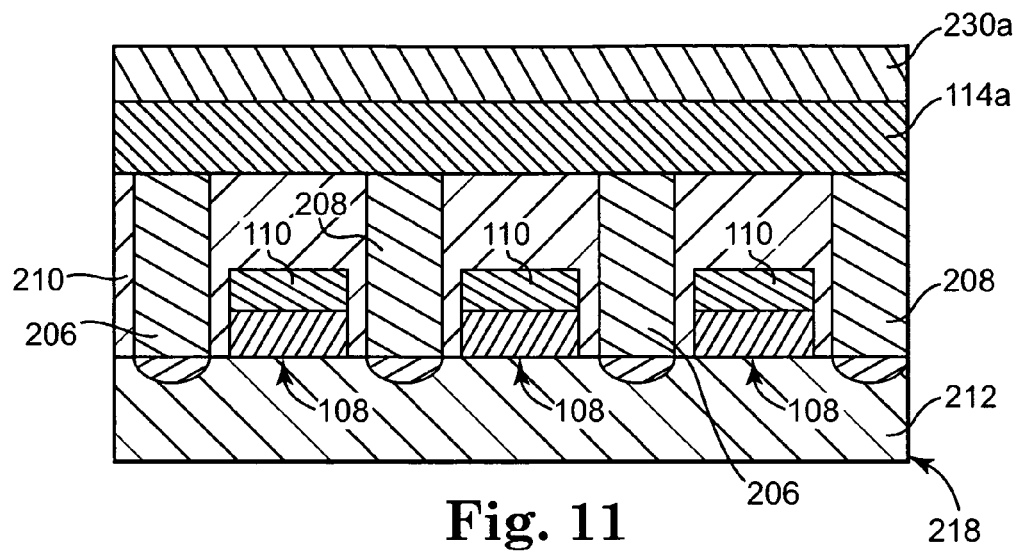
FIG. 11 illustrates a cross-sectional view of one embodiment of the preprocessed wafer, a conductive material layer, and a first dielectric material layer.

FIG. 11 illustrates a cross-sectional view of one embodiment of preprocessed wafer 218, a conductive material layer 114*a*, and a first dielectric material layer 230*a*. Conductive material, such as W, Al, Cu, or other suitable conductive material is deposited over preprocessed wafer 218 to provide conductive material layer 114*a*. Conductive material layer 114*a* is deposited using CVD, ALD, MOCVD, PVD, JVP, or other suitable deposition technique.

Dielectric material, such as SiN or other suitable dielectric material, is deposited over conductive material layer 114*a* to provide first dielectric material layer 230*a*. First dielectric material layer 230*a* is deposited using CVD, ALD, MOCVD, PVD, JVP, HDP, or other suitable deposition technique.

Figure 12:
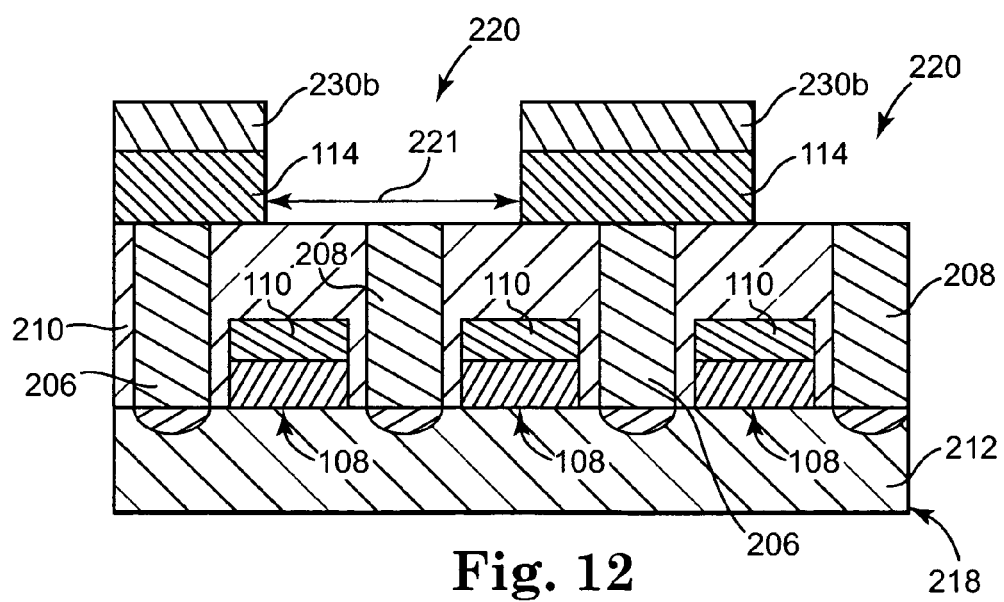
FIG. 12 illustrates a cross-sectional view of one embodiment of the preprocessed wafer, ground lines, and first dielectric material layer after etching.

FIG. 12 illustrates a cross-sectional view of one embodiment of preprocessed wafer 218, ground lines 114, and first dielectric material layer 230*b* after etching first dielectric material layer 230*a* and conductive material layer 114*a*. First dielectric material layer 230*a* and conductive material layer 114*a* are etched to provide first dielectric material layer 230*b* and ground lines 114 and to form trenches 220. Line lithography is used to pattern trenches 220 having a width 221 to expose second contacts 208. The line lithography does not need to be precisely centered over second contacts 208 as long as second contacts 208 are exposed. In this way, the line lithography is less critical yet the desired memory cell size is obtained.

Figure 13:
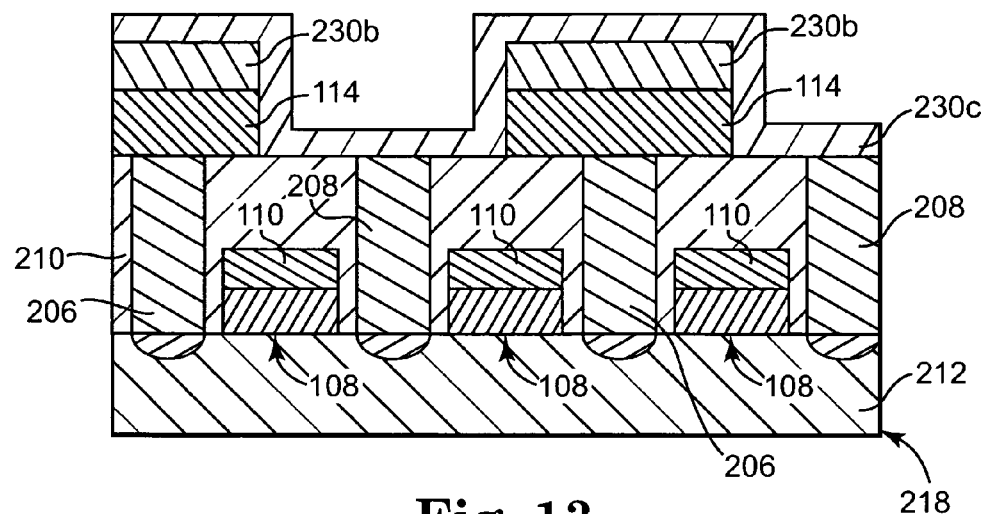
FIG. 13 illustrates a cross-sectional view of one embodiment of the preprocessed wafer, ground lines, first dielectric material layer, and a second dielectric material layer.

FIG. 13 illustrates a cross-sectional view of one embodiment of preprocessed wafer 218, ground lines 114, first dielectric material layer 230*b*, and a second dielectric material layer 230*c*. Dielectric material, such as SiN or other suitable dielectric material, is conformally deposited over exposed portions of first dielectric material layer 230*b*, ground lines 114, and preprocessed wafer 218 to provide second dielectric material layer 230*c*. Second dielectric material layer 230*c* is deposited using CVD, ALD, MOCVD, PVD, JVP, HDP, or other suitable deposition technique.

Figure 14:
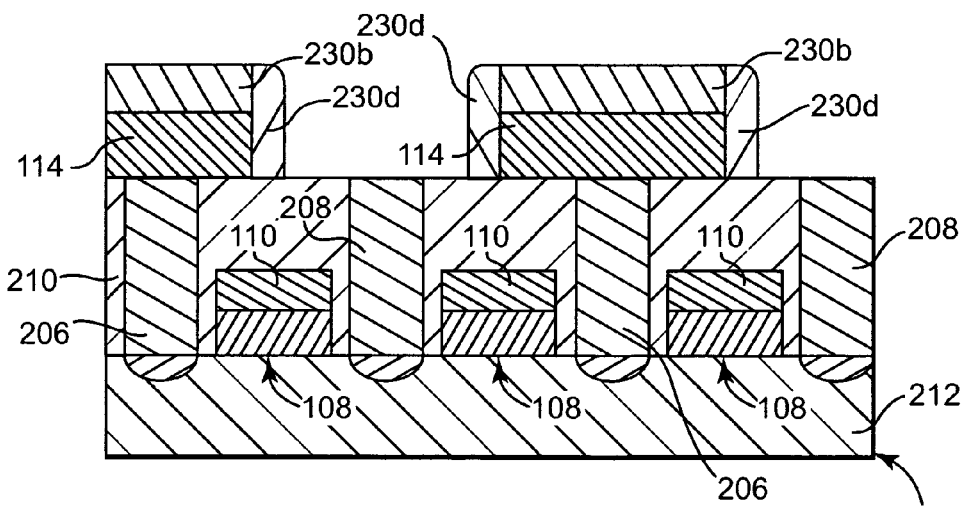
FIG. 14 illustrates a cross-sectional view of one embodiment of the preprocessed wafer, ground lines, first dielectric material layer, and sidewall spacers after etching.

FIG. 14 illustrates a cross-sectional view of one embodiment of preprocessed wafer 218, ground lines 114, first dielectric material layer 230*b*, and sidewall spacers 230*d* after etching second dielectric material layer 230*c*. Second dielectric material layer 230*c* is etched using a spacer etch to form sidewall spacers 230*d* and to expose second contacts 208. First dielectric material layer 230*b* and sidewall spacers 230*d* are collectively referred to as dielectric material 230.

Figure 15A:
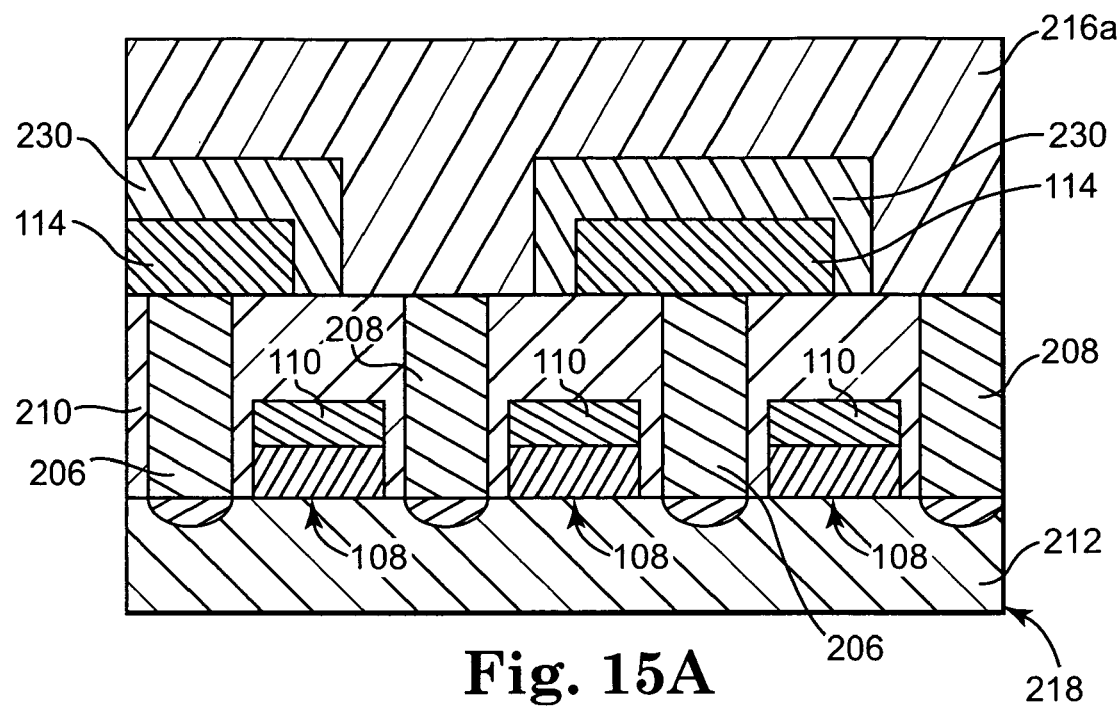
FIG. 15A illustrates a cross-sectional view of one embodiment of the preprocessed wafer, encapsulated ground lines, and a dielectric material layer.
Figure 15B:
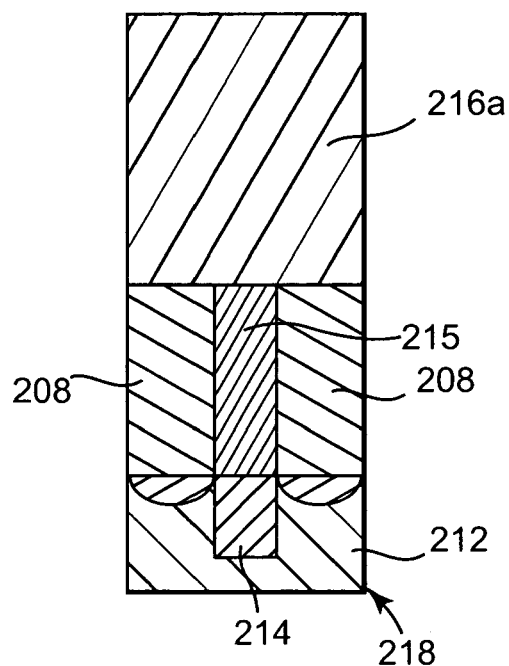
FIG. 15B illustrates a perpendicular cross-sectional view of the wafer illustrated in FIG. 15A.

FIG. 15A illustrates a cross-sectional view of one embodiment of preprocessed wafer 218, ground lines 114 encapsulated by dielectric material 230, and a dielectric material layer 216*a*. FIG. 15B illustrates a perpendicular cross-sectional view of the wafer illustrated in FIG. 15A. Dielectric material, such as SiO$_2$, FSG, BPSG, BSG, or other suitable dielectric material, is deposited over exposed portions of dielectric material 230 and preprocessed wafer 218 to provide dielectric material layer 216*a*. Dielectric material layer 216*a* is deposited using CVD, ALD, MOCVD, PVD, JVP, HDP, or other suitable deposition technique.

Figure 16A:
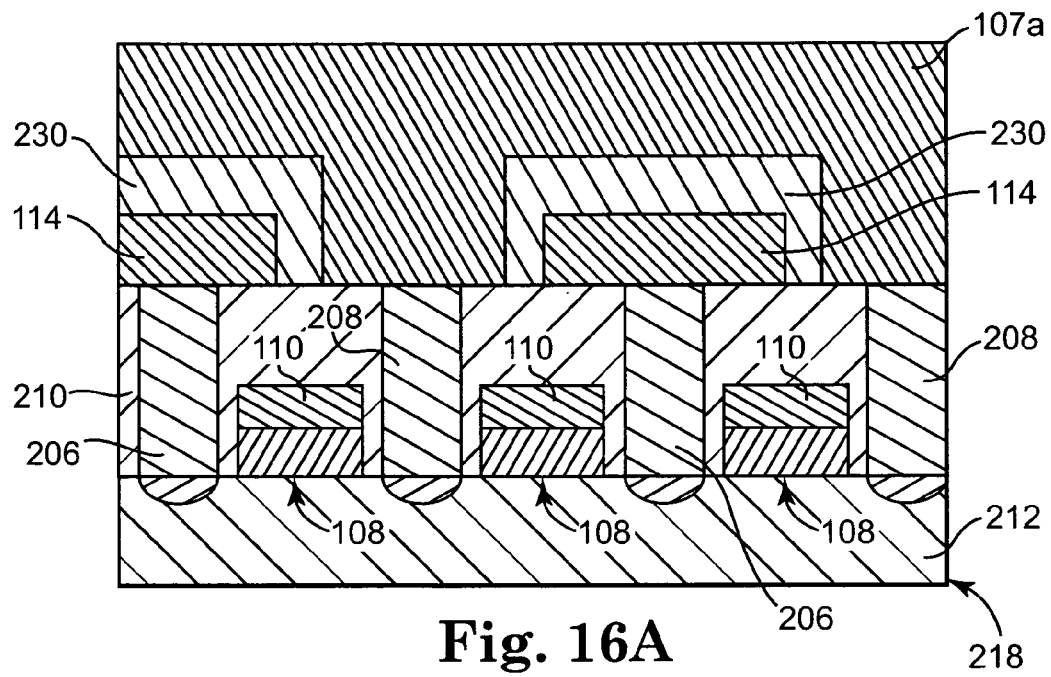
FIG. 16A illustrates a cross-sectional view of one embodiment of the preprocessed wafer, encapsulated ground lines, dielectric material layer, and a phase change material layer.
Figure 16B:
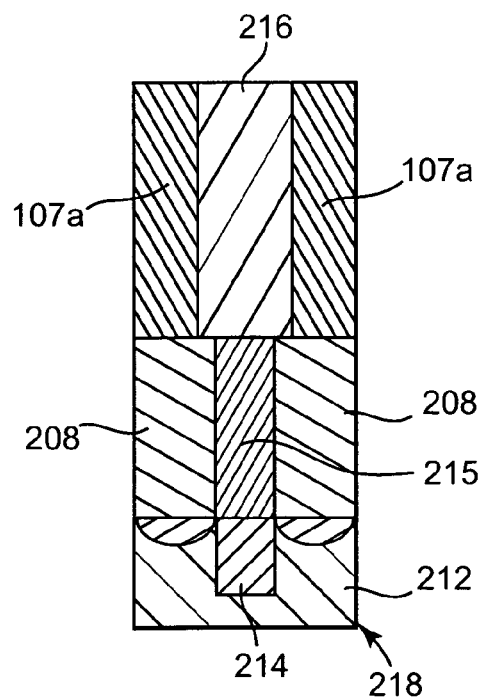
FIG. 16B illustrates a perpendicular cross-sectional view of the wafer illustrated in FIG. 16A.

FIG. 16A illustrates a cross-sectional view of one embodiment of preprocessed wafer 218, ground lines 114 encapsulated by dielectric material 230, dielectric material layer 216, and a phase change material layer 107*a*. FIG. 16B illustrates a perpendicular cross-sectional view of the wafer illustrated in FIG. 16A. Dielectric material layer 216*a* is etched to provide dielectric material layer 216. Line lithography is used to pattern trenches perpendicular to trenches 220 such that second contacts 208 and portions of dielectric material 230 are exposed. The line lithography does not need to be precisely centered over second contacts 208 as long as second contacts 208 are exposed. In this way, the line lithography is less critical yet the desired memory cell size is obtained.

Phase change material, such as a chalcogenide compound material or other suitable phase change material, is deposited over exposed portions of dielectric material layer 216, dielectric material 230, and preprocessed wafer 218 to provide a phase change material layer. The phase change material layer is deposited using CVD, ALD, MOCVD, PVD, JVP, or other suitable deposition technique. The phase change material layer is planarized to expose dielectric material layer 216 to provide phase change material layer 107*a*. The phase change material layer is planarized using CMP or another suitable planarization technique.

FIG. 17A illustrates a cross-sectional view of one embodiment of preprocessed wafer 218, ground lines 114 encapsulated by dielectric material 230, phase change material layer 107, and bit lines 112. FIG. 17B illustrates a perpendicular cross-sectional view of the wafer illustrated in FIG. 17A, and FIG. 17C illustrates a top view of the wafer illustrated in FIG. 17A. Phase change material layer 107*a* is recess etched to provide phase change material layer 107. Electrode material, such as TiN, TaN, W, Al, Cu, TiSiN, TaSiN, or other suitable electrode material, is deposited over phase change material layer 107 and dielectric material layer 216 to provide an electrode material layer. The electrode material layer is deposited using CVD, ALD, MOCVD, PVD, JVP, or other suitable deposition technique. The electrode material layer is planarized to expose dielectric material layer 216 to provide bit lines 112. The electrode material layer is planarized using CMP or another suitable planarization technique to provide array of phase change memory cells 200*a* illustrated in FIGS. 2A-2C.

Embodiments of the present invention provide an array of phase change memory cells fabricated using line lithography and self-aligned processing to minimize critical lithography steps. In addition, interface resistances between metal and active material in the array is overlay-insensitive and by maximizing the interface areas, parasitic resistances are minimized. The array of phase change memory cells has an improved chemical mechanical planarization (CMP) process window and improved mechanical stability during fabrication.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
    transistors in rows and columns providing an array;
    first conductive lines in columns across the array;
    second conductive lines encapsulated by dielectric material in rows across the array, each second conductive line coupled to one side of the source-drain path of the transistors in each row; and
    phase change elements between the second conductive lines and contacting the first conductive lines and self-aligned to the first conductive lines, each phase change element coupled to the other side of the source-drain path of a transistor.

2. The memory of claim 1, wherein the first conductive lines are bit lines and the second conductive lines are ground lines.

3. The memory of claim 1, further comprising:
word lines in rows across the array, each word line coupled to gates of the transistors in each row.

4. The memory of claim 1, wherein the memory is scalable to $6F^2$, where F is a minimum feature size.

5. The memory of claim 1, wherein the memory is scalable to $8F^2$, where F is a minimum feature size.

6. A memory comprising:
transistors in rows and columns providing an array;
first conductive lines in columns across the array;
second conductive lines encapsulated by dielectric material in rows across the array, each second conductive line coupled to one side of the source-drain path of the transistors in each row; and
phase change material in columns across the array and providing storage locations between the second conductive lines, the phase change material contacting the first conductive lines and self-aligned to the first conductive lines, each storage location coupled to the other side of the source-drain path of a transistor.

7. The memory of claim 6, wherein the first conductive lines are bit lines and the second conductive lines are ground lines.

8. The memory of claim 6, further comprising:
word lines in rows across the array, each word line coupled to gates of the transistors in each row.

9. The memory of claim 6, wherein the memory is scalable to $6F^2$, where F is a minimum feature size.

10. The memory of claim 6, wherein the memory is scalable to $8F^2$, where F is a minimum feature size.

11. An integrated circuit comprising:
transistors in rows and columns providing an array;
first conductive lines in columns across the array;
second conductive lines encapsulated by dielectric material in rows across the array, each second conductive line coupled to one side of the source-drain path of the transistors in each row; and
resistance changing elements between the second conductive lines and contacting the first conductive lines and self-aligned to the first conductive lines, each resistance changing element coupled to the other side of the source-drain path of a transistor.

12. The integrated circuit of claim 11, wherein the first conductive lines are bit lines and the second conductive lines are ground lines.

13. The integrated circuit of claim 11, further comprising:
word lines in rows across the array, each word line coupled to gates of the transistors in each row.

14. The integrated circuit of claim 11, wherein the integrated circuit is scalable to $6F^2$, where F is a minimum feature size.

15. The integrated circuit of claim 11, wherein the integrated circuit is scalable to $8F^2$, where F is a minimum feature size.

16. The integrated circuit of claim 11, wherein the resistance changing elements comprise phase change elements.

17. An integrated circuit comprising:
transistors in rows and columns providing an array;
first conductive lines in columns across the array;
second conductive lines encapsulated by dielectric material in rows across the array, each second conductive line coupled to one side of the source-drain path of the transistors in each row; and
resistance changing material in columns across the array and providing storage locations between the second conductive lines, the resistance changing material contacting the first conductive lines and self-aligned to the first conductive lines, each storage location coupled to the other side of the source-drain path of a transistor.

18. The integrated circuit of claim 17, wherein the first conductive lines are bit lines and the second conductive lines are ground lines.

19. The integrated circuit of claim 17, further comprising:
word lines in rows across the array, each word line coupled to gates of the transistors in each row.

20. The integrated circuit of claim 17, wherein the integrated circuit is scalable to $6F^2$, where F is a minimum feature size.

21. The integrated circuit of claim 17, wherein the integrated circuit is scalable to $8F^2$, where F is a minimum feature size.

22. The integrated circuit of claim 17, wherein the resistance changing material comprises phase change material.

* * * * *